US012610604B2

(12) United States Patent　　　　(10) Patent No.:　US 12,610,604 B2
Mazza et al.　　　　　　　　　　　(45) Date of Patent:　　Apr. 21, 2026

(54) CROSS COUPLE DESIGN FOR HIGH DENSITY STANDARD CELLS

(71) Applicant: GLOBALFOUNDRIES U.S. Inc., Malta, NY (US)

(72) Inventors: James P. Mazza, Saratoga Springs, NY (US); Jia Zeng, Sunnyvale, CA (US); Xuelian Zhu, San Jose, CA (US); Mahbub Rashed, Cupertino, CA (US); Neha Nayyar, Clifton Park, NY (US); Collin A. Tranter, Clifton, NY (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 409 days.

(21) Appl. No.: 17/834,053

(22) Filed: Jun. 7, 2022

(65) Prior Publication Data

US 2023/0395675 A1　　Dec. 7, 2023

(51) Int. Cl.
　　*H10D 64/27*　　　　(2025.01)
(52) U.S. Cl.
　　CPC ................................. *H10D 64/518* (2025.01)
(58) Field of Classification Search
　　CPC ........... H01L 29/42376; H01L 29/4238; H01L 23/5221; H10D 64/518–519
　　See application file for complete search history.

(56) References Cited

U.S. PATENT DOCUMENTS

| | | | |
|---|---|---|---|
| 9,142,513 B2 | 9/2015 | Rashed et al. | |
| 9,159,724 B2 | 10/2015 | Wang et al. | |
| 9,324,715 B2 | 4/2016 | Azmat et al. | |
| 9,570,434 B2 | 2/2017 | Kang et al. | |
| 9,589,899 B2 * | 3/2017 | Jun ..................... H01L 27/0207 |
| 10,249,605 B2 * | 4/2019 | Subhash ............. H01L 23/5283 |
| 2018/0025968 A1 | 1/2018 | Liu et al. | |
| 2020/0227411 A1 * | 7/2020 | Wang .................... H10B 41/10 |
| 2021/0193669 A1 | 6/2021 | Ahmed et al. | |

FOREIGN PATENT DOCUMENTS

CN　　　　111863817 A　 * 10/2020　 ....... H01L 21/76816

OTHER PUBLICATIONS

DPMA Office Action dated Nov. 12, 2025 in DE Application No. 10 2023 111 517.0, 12 pages.

* cited by examiner

*Primary Examiner* — Monica D Harrison
*Assistant Examiner* — Moataz Khalifa
(74) *Attorney, Agent, or Firm* — David Cain; Andrew M. Calderon; Calderon Safran & Wright P.C.

(57)　　　　　ABSTRACT

The present disclosure relates to semiconductor structures and, more particularly, to a cross couple design for high density standard cells and methods of manufacture. The structure includes a first contact connected in a cross couple circuit to at least two gate structures, and a second contact connected to the first contact at a location which is devoid of any via connection.

20 Claims, 8 Drawing Sheets

10c

CROSS COUPLE DESIGN FOR HIGH DENSITY STANDARD CELLS

BACKGROUND

The present disclosure relates to semiconductor structures and, more particularly, to a cross couple design for high density standard cells and methods of manufacture.

As technology scales, the importance of logic scaling also grows. However, traditional approaches to scaling of standard cells (e.g., the building blocks of logic design) are not effective due to lithographic limitations. Cross-coupling techniques have been implemented to mitigate the effects of such lithographic limitations to provide continued scaling of standard cells. For example, a cross couple may be implemented by inserting a dummy polysilicon gate, which causes an area bloat, or by using a sub-ground rule special construct in a middle of the line (MOL). However, complex layout designs such as the cross couple are also becoming increasingly difficult to enable as technology scales.

SUMMARY

In an aspect of the disclosure, a structure comprises: a first contact connected in a cross couple circuit to at least two gate structures; and a second contact connected to the first contact at a location which is devoid of any via connections.

In an aspect of the disclosure, a structure comprises: a first gate line; a second gate line separated from and diagonally positioned from the first gate line; a contact that connects to both the first gate line and the second gate line, on a first wiring layer; and a wiring structure connecting to the contact and active regions of the first gate line and the second gate line.

In an aspect of the disclosure, a method comprises: forming a first contact connected in a cross couple circuit to at least two gate structures; and forming a second contact to the first contact at a location which is devoid of any via connections.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a cross couple design for high density standard cells and methods of manufacture. In embodiments, two adjacent gates may be cut into segments, with a diagonal contact connected to two segments, and a horizontal co-planar contact connected to the diagonal gate contact on a same level as the diagonal contact. Advantageously, logic area scaling is improved, and no additional mask adders are required in comparison to known circuit layouts.

In contrast to known circuits, the present disclosure includes an additional diagonal contact added to directly connect polysilicon gate segments on a single mask layer. Further, an additional horizontal contact may be used for a middle of line (MOL) connection to the diagonal contact in a standard cell. Thus, in contrast to known circuits, the present disclosure improves logic area scaling, does not require any additional mask adders, and improves MOL congestion.

In more specific embodiments of the present disclosure, a structure includes: a first gate contact connected to at least two gate segments in a cross couple circuit, and a second MOL contact connected to the first gate contact at a contact point of the cross couple circuit. In further aspects, a logic gate circuit includes: a first set of polysilicon gate lines connected through a base metal layer; a second set of polysilicon gate lines connected to the first set of polysilicon gate lines through a first metal line; a second metal line connected to the first metal line through a plurality of metal layers higher than the base metal layer; and the second metal line co-planar with the first metal line.

The cross couple design for high density standard cells of the present disclosure may be manufactured in a number of ways using a number of different tools. In general, though, the methodologies and tools are used to form structures with dimensions in the micrometer and nanometer scale. The methodologies, i.e., technologies, employed to manufacture the cross couple design for high density standard cells of the present disclosure have been adopted from integrated circuit (IC) technology. For example, the structures are built on wafers and are realized in films of material patterned by photolithographic processes on the top of a wafer. In particular, the fabrication of the photonic chip security structure uses three basic building blocks: (i) deposition of thin films of material on a substrate, (ii) applying a patterned mask on top of the films by photolithographic imaging, and (iii) etching the films selectively to the mask.

Figure 1A:
FIG. 1A shows a cross couple design in accordance with aspects of the present disclosure.
Figure 1B:
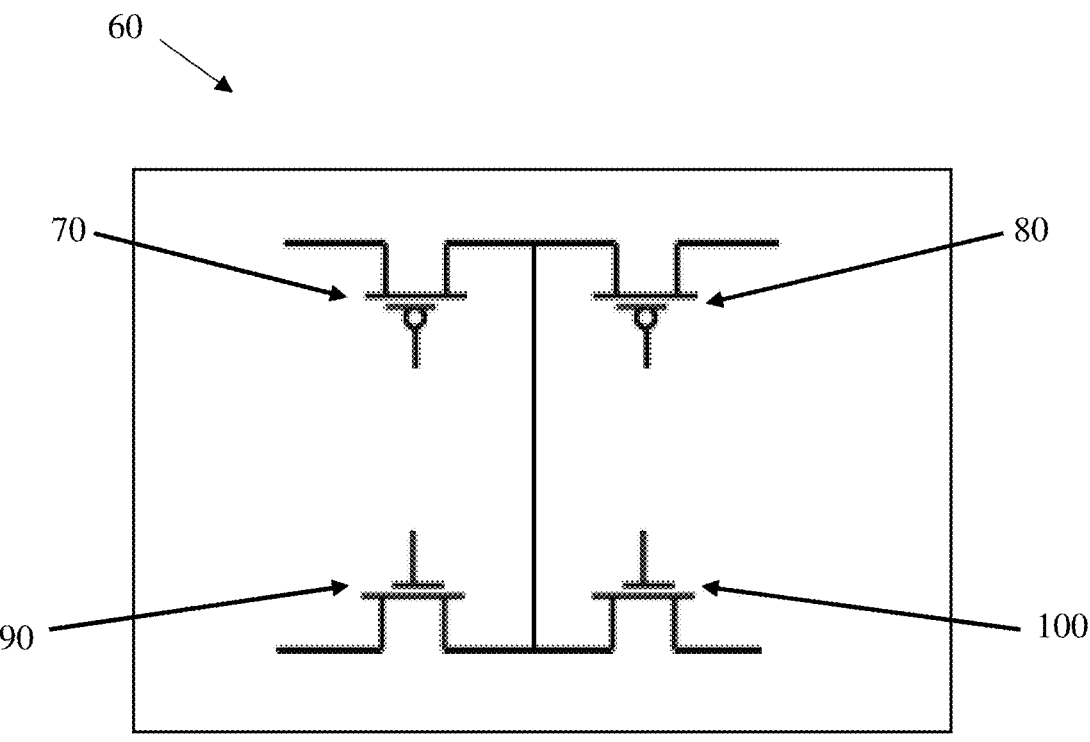
FIG. 1B shows a cross couple circuit which corresponds with the cross couple design of FIG. 1A, in accordance with aspects of the present disclosure.

FIGS. 1A and 1B show a cross couple design and a cross couple circuit, respectively, in accordance with aspects of the present disclosure. In embodiments, the structure 10 may be formed using semiconductor-on-insulator (SOI), a bulk wafer, or utilizing FinFet technologies. In an example, the structure 10 may include a semiconductor-on-insulator (SOI) substrate composed of any suitable semiconductor material including, but not limited to, Si, SiGe, SiGeC, SiC, GaAs, InAs, InP, and other III/V or II/VI compound semi-conductors. Also, a standard flip-flop logic circuit may include three cross couple circuits (e.g., three cross couple circuits 60 in FIG. 1B). Further, the flip-flop logic circuit may be approximately 40% of the logic content by area. Therefore, the present disclosure enables an approximate 10% area savings in sequential logic (e.g., flip flop area) which corresponds to an approximate 4% reduction in logic scaling area.

The structure 10 shown in FIGS. 1A and 1B includes upper FETs 70, 80 and lower FETs 90, 100. In embodiments, the FETs 70, 80 may be PFETs, whereas, the FETs 90, 100 may be NFETs. In embodiments, the FETs 70, 90 and FETs 80, 100 may be separated by a gate cut 30. As should be understood by those of skill in the art, the PFETs 70, 80 and the NFETs 90, 100 form a cross couple circuit 60 as depicted in the circuit of FIG. 1B. And, as should further be understood, the structure 10 may be used for specific layout connections prevalent in a sequential logic.

A standard gate contact 20 contacts each of the FETs 80, 90. A diagonal gate contact 40 connects the FETs 70, 100. The diagonal contact 40 spans across or over the gate cut 30. The standard gate contact 20, the gate cut 30, and the diagonal contact 40 are within shallow trench isolation (STI) regions. The diagonal gate contact 40 allows a connection between the FETs 70, 100, without requiring insertion of a dummy gate structure (which also saves area). A metal layer 25 (on a first metal layer, M1), extends over the diagonal gate contact 40 and connects to the active regions 50. A gate structure (i.e., transistor) 55 may be provided on sides of the FETs 70, 80, 90, 100.

Still referring to FIGS. 1A and 1B, each FET 70, 80, 90, 100 may be polysilicon gate structures (i.e., a polysilicon gate line), which traverse, e.g., extend across, multiple active regions in a vertical direction. As an example, the FET 70 (e.g., gate line) may be separated from and diagonally positioned from of the FET 100 (e.g., gate line) in a cross couple circuit configuration. The diagonal gate contact 40 may connect to the FET 70 and the FET 100. The base metal layer (i.e., the metal layer 25) may be a wiring structure connected to at least one of the source/drain nodes of the FETs 70,80, 90, 100 through the active regions 50. For example, as shown in FIG. 1A, the metal layer 25 may be a wiring structure connected to the diagonal gate contact 40 and the active regions 50 of the gate lines corresponding to the FETs 70, 100. The FETs 80, 90 are parallel to the FETs 70, 100 and are separated from one another by the gate cut 30.

It should be understood by those of skill in the art, though, that the FETs 70, 80, 90, 100 may be polysilicon gate structures (i.e., a polysilicon gate line) or metal gate structures using conventional workfunction metals, e.g., tungsten, etc. Also, in embodiments, the FETs 70, 80, 90, 100 may be fabricated using known first gate processes or replacement gate processes such that no further explanation is required herein for a complete understanding of the present disclosure. For example, the FETs 70, 80, 90, 100 may be finFETs manufactured using conventional sidewall image transfer (SIT) or self-aligned couple patterning (SADP) processes. In embodiments, the diagonal gate contact 40 may have a same material or different material as the FETs 70, 80, 90, 100.

In FIG. 1A, the standard gate contact 20 may be co-planar with the diagonal gate contact 40 (i.e., on a same layer/level) and may connect to the gates of the FETs 80, 90. In this way, it is possible to simplify the fabrication processes by saving masking processes. In addition, the diagonal gate contact 40 may be directly contacting the FETs 70, 100 in a MOL layer without the need for any additional via or MOL connections.

Figure 2:
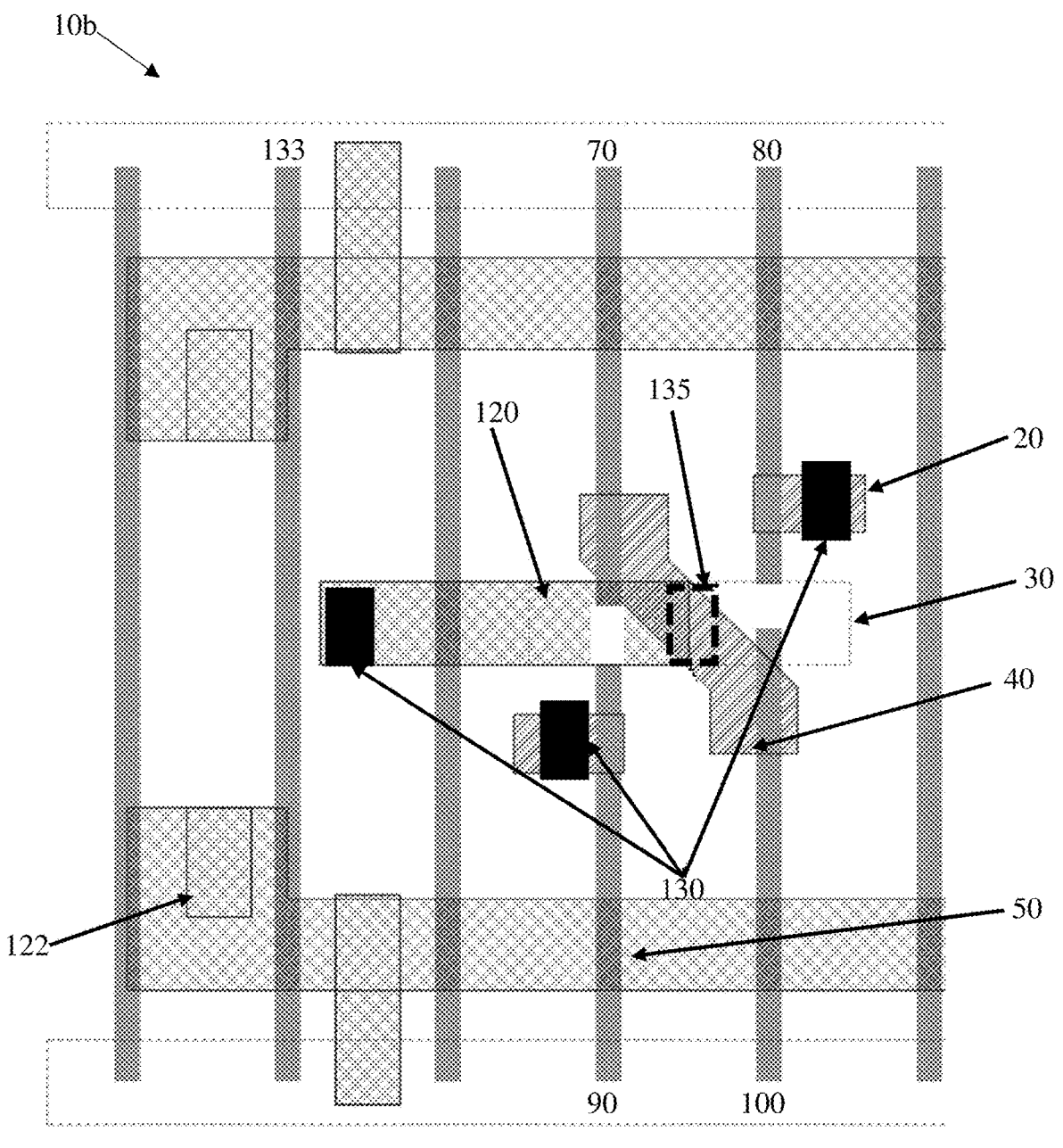
FIG. 2 shows a cross couple design with a horizontal contact in accordance with aspects of the present disclosure.
Figure 3:
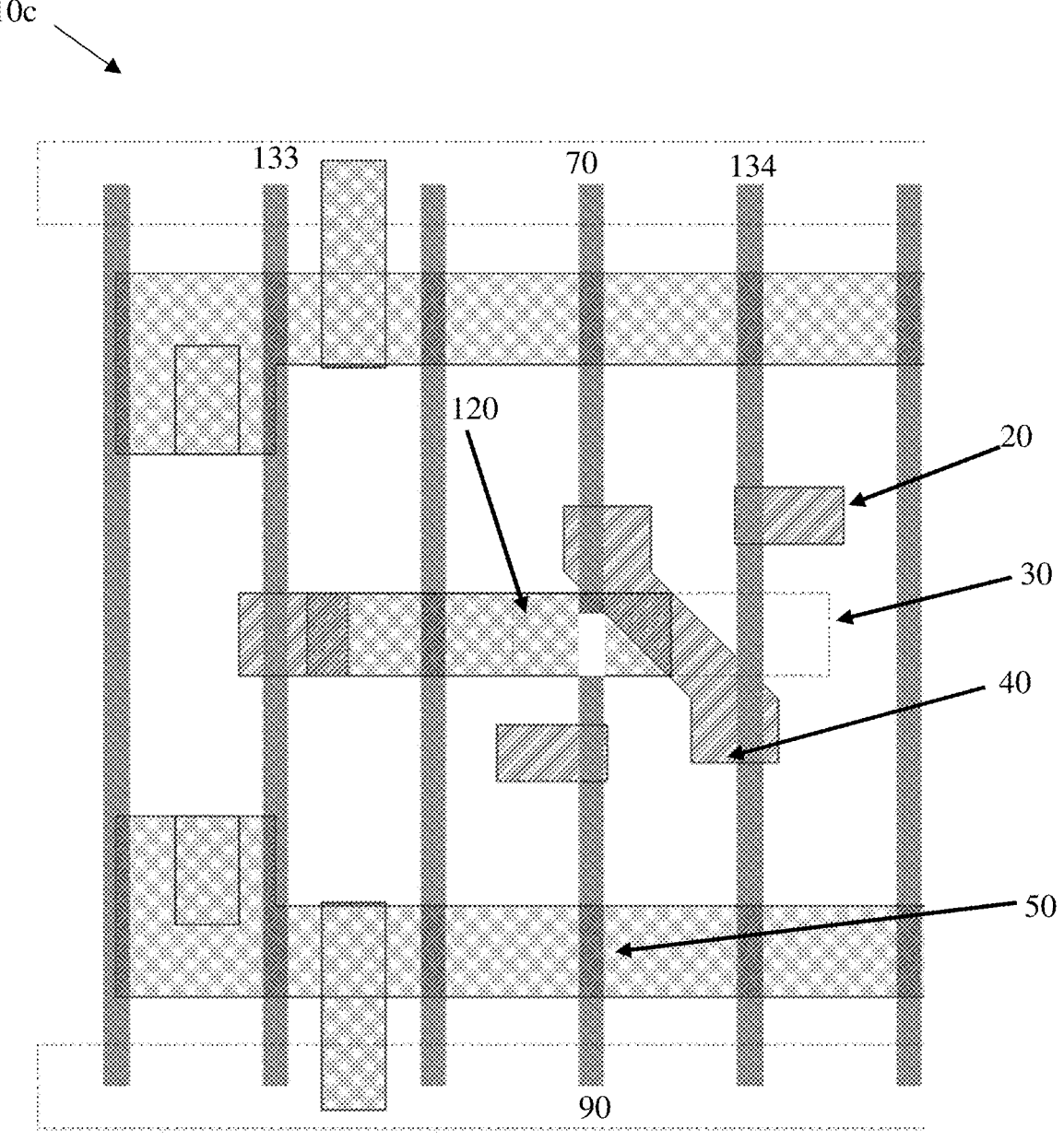
FIGS. 3-7 show alternative cross couple designs with different connection schemes in accordance with aspects of the present disclosure.

FIG. 2 shows a cross couple design with a horizontal contact in accordance with aspects of the present disclosure. FIG. 2 is similar to FIG. 1A, with the exception of the horizontal contact 120, via contacts 130, and area 135. In particular, the structure 10*b* of FIG. 2 includes the standard gate contacts 20, the gate cut 30, the diagonal gate contact 40, the active region 50, a horizontal contact 120, contact 122, FET 133, the FETs 70, 80, 90, 100, via contacts 130, and area 135. The standard gate contact 20 is remote from the diagonal gate contact 40 and connects to gates of the FETs 80, 90. Further, the standard gate contact 20 is on a same wiring level as the diagonal contact 40 and the horizontal contact 120.

In FIG. 2, the horizontal contact 120 may be a rectangular shape connecting to the diagonal gate contact 40. In embodiments, the horizontal contact 120 connects to the diagonal gate contact 40 through a plurality of metal lines which are higher than the base metal layer (i.e., the metal layer 25 shown in FIG. 1A). The diagonal gate contact 40 may include a convex shape at the ends, i.e., shapes which are parallel to the gates of the FETs 70, 100. That is, in embodiments, the diagonal gate contact 40 may have a shape comprising a diagonal portion spanning between the FETs 70, 100 (i.e., extend over the gates of the FETs 70 and 100), with ends that run parallel to the direction of the FETs 80, 90.

In the embodiment shown in FIG. 2, the horizontal contact 120 may be separated or isolated from the gates of FETs 70, 80, 90, 100 due to a nitride liner cap in between. In more specific embodiments, a silicon carbon nitride (SiCN) liner cap may be used as an etch stop over the gates of FETs 70, 80, 90, 100. As a result, the standard gate contact 20 contacts (i.e., directly contacts) the gates of FETs 80, 90 and the horizontal contact 120; however, the horizontal contact 120 does not connect to the FETs 80, 90.

In FIG. 2, via congestion is avoided by having no via connection at area 135 (i.e., an area devoid of any via connections at a location in which the horizontal contact 120 connects to the diagonal gate contact 40). Further, the horizontal contact 120 extends over the gate cut 30, which separates gates of the FETs 80, 100. In this way, it is possible to have the horizontal contact 120 and the diagonal gate contact 40 co-planar to each other and at a same wiring level. The horizontal contact 120 and the diagonal gate contact 40 may include a same material, i.e., tungsten. Accordingly, it is possible to have an approximately 10% area savings in sequential logic and 4% total logic scaling, with no additional masks required.

FIGS. 3-7 show alternative cross couple designs with different connection schemes in accordance with aspects of the present disclosure. For example, in structure 10*c* of FIG. 3, the horizontal contact 120 may be connected to the gate of FET 133. Also, in FIG. 3, there is only one gate cut such that the horizontal contact 120 spans over the gate of FET 133. The gate of FET 134 may connect to the gate of FET 70 by the diagonal contact 40. The connection between horizontal contact 120 and the gate may be at a metal layer or at a gate contact.

Figure 4:
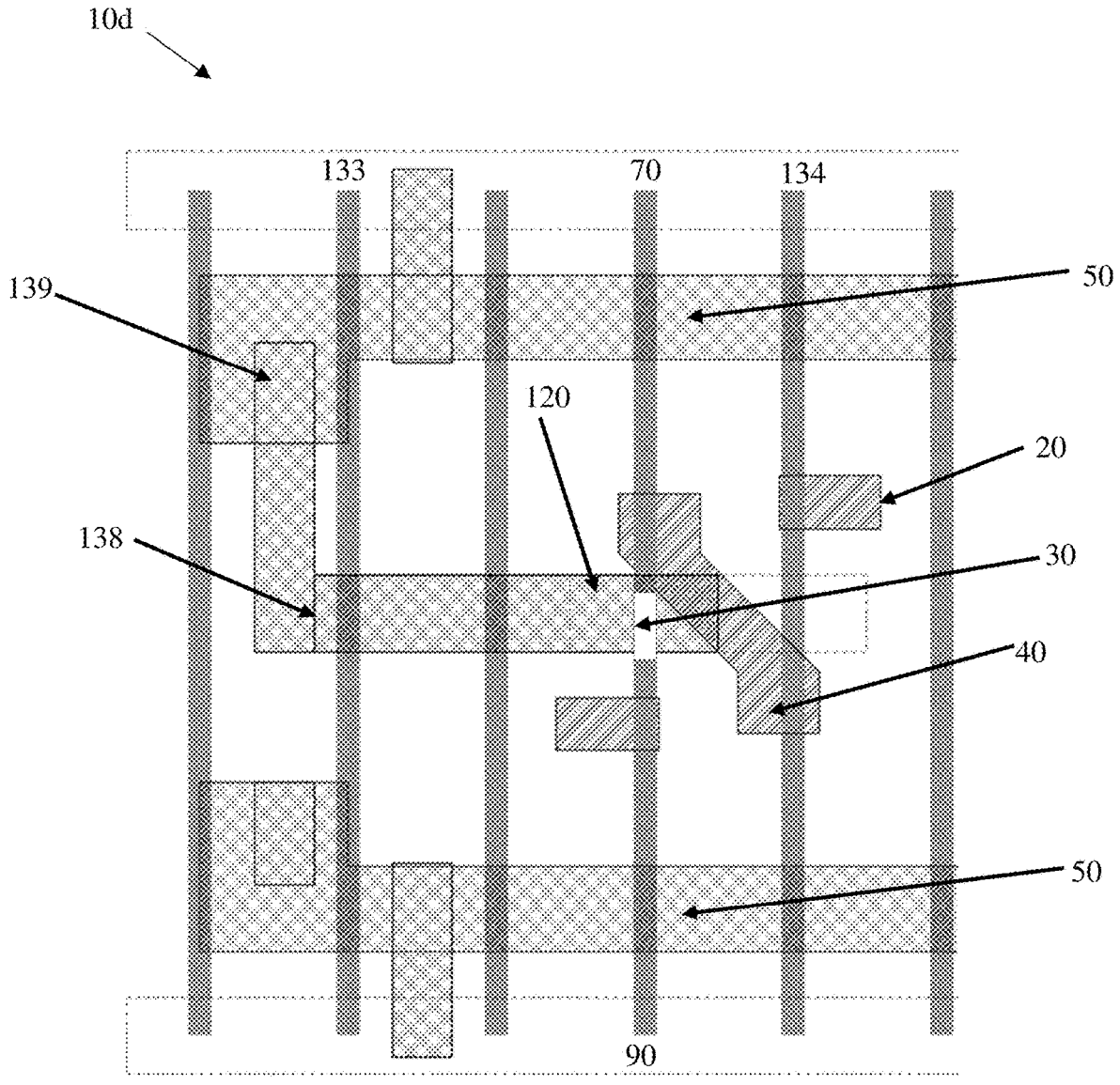

In FIG. 4, the structure 10*d* includes a contact 138 connected to the horizontal contact 120 and a tab portion 139 of the active region. The contact 138 may be an L-shape extending between the diagonal gate contact 40 and the active region 50. The contact 138 may also extend over a single gate cut 30. The remaining features of the structure 10*d* may be similar to the structure shown in FIG. 3 such that no further explanation is required for a complete understanding of the present disclosure.

Figure 5:
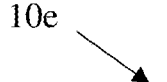
Figure 5:
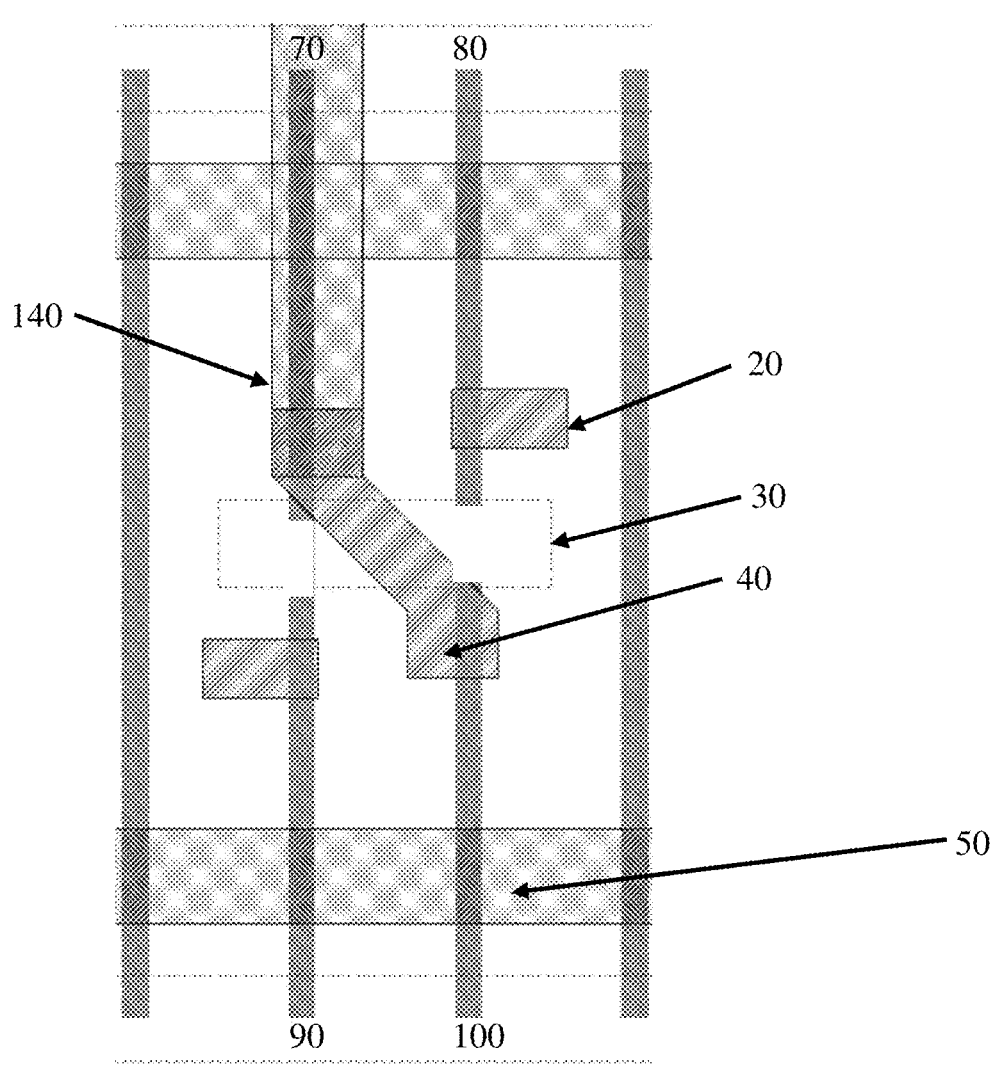

In FIG. 5, the structure 10*e* includes a vertical contact 140 connected to the diagonal contact 40 and extends parallel to the FETs 70, 80, 90, 100. In embodiments, the vertical contact 140 may be parallel to and extends directly over the gate of the FET 70, and the diagonal contact 40 has an end that extends over the gate of the FET 70; although other configurations are also possible, e.g., directly over any of the FETs, depending on the design. The vertical contact 140 may connect directly to the FET 70. In another embodiment, the vertical contact 140 may not connect directly to the FET 70. The remaining features of the structure 10*e* may be similar to the structure shown in FIG. 1 such that no further explanation is required for a complete understanding of the present disclosure.

Figure 6:
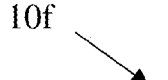
Figure 6:
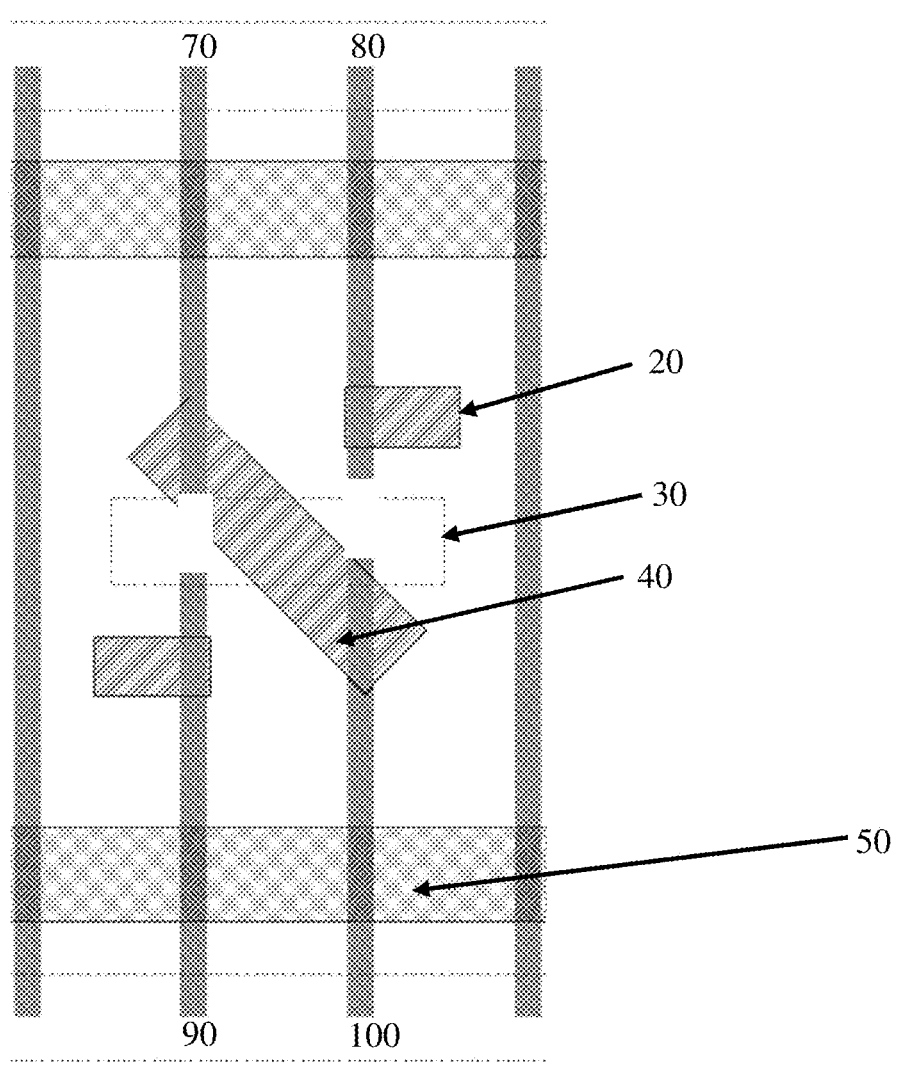
Figure 7:
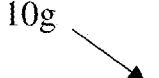
Figure 7:
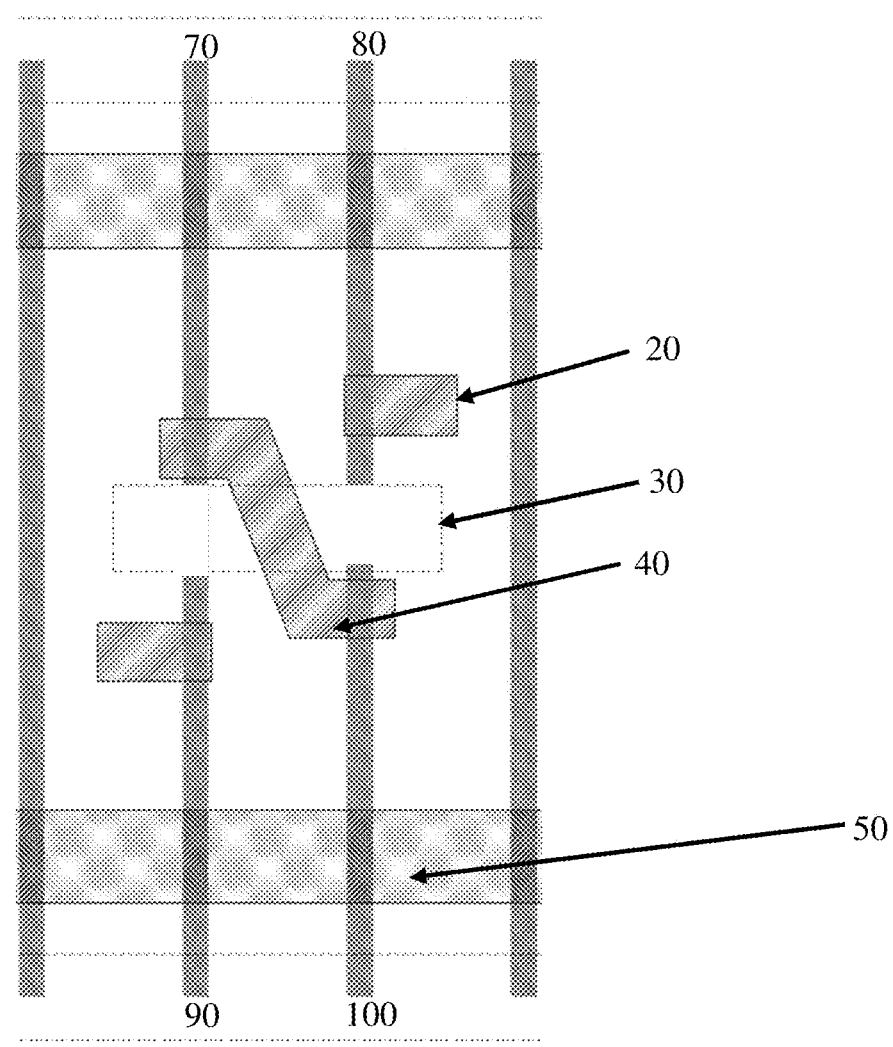

In FIG. 6, the structure 10*f* includes the diagonal gate contact 40 with a straight profile, i.e., no convex or convex shape at the ends. Also, in this embodiment, the diagonal gate contact 40 may extend beyond the FETs 70, 100. The remaining features of the structure 10f may be similar to the structure shown in FIG. 1 such that no further explanation is required for a complete understanding of the present disclosure In FIG. 7, the structure 10g includes the diagonal gate contact 40 in an inverted S-shape or elongated Z-shape (e.g., concave head style), for example. In this configuration, the gate contact has ends which are perpendicular to a length of gates of the FETs 70, 100. The remaining features of the structure 10g may be similar to the structure shown in FIG. 1 such that no further explanation is required for a complete understanding of the present disclosure.

The cross couple design for high density standard cells may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a first contact connected in a cross couple circuit to at least two gate structures; and
a second contact connected to the first contact at a location which is devoid of any via connections, the second contact comprising a horizontal contact portion comprising an end of which is connecting to the first contact and extending over a gate cut in a non-active region of a first of the at least two gate structures and over additional gate structures, and a tab contact portion extending orthogonal to the horizontal contact portion and connecting to an active region of the cross couple circuit.

2. The structure of claim 1, wherein the location which is devoid of any via connections is between the at least two gate structures, and the first contact comprises a diagonal contact, and further comprising an insulating liner cap to separate the second contact from at least one gate structure.

3. The structure of claim 2, wherein the first contact and the second contact are co-planar and at a same wiring level.

4. The structure of claim 3, further comprising additional gate contacts remote from the first contact and which connect to the additional gate structures, and which are on the same wiring level as the first contact and the second contact.

5. The structure of claim 1, wherein the first contact comprises a diagonal shape which connects to the at least two gate structures.

6. The structure of claim 5, wherein the diagonal shape comprises ends that are parallel and extend over the at least two gate structures.

7. The structure of claim 1, wherein the second contact is L-shaped and extends from the first contact to the active region.

8. The structure of claim 7, wherein the L-shaped contact extends over a single gate cut, and wherein the gate cut is within a shallow trench isolation structure (STI) region.

9. The structure of claim 1, wherein the first contact comprises a diagonal contact and has an end that extends over a first gate structure of the at least two gate structures and the second contact is parallel to and extends over the first gate structure.

10. The structure of claim 1, wherein the first contact comprises a diagonal shape with ends that are perpendicular to a length of each of the at least two gate structures.

11. The structure of claim 1, wherein the first contact and the second contact comprise a same material.

12. A structure as claimed in claim 1, further comprising a nitride liner cap to separate the second contact from at least one gate structure.

13. A structure comprising:
a first gate line;
a second gate line separated from and diagonally positioned from the first gate line;
a contact that connects to both the first gate line and the second gate line, on a first wiring layer;
a wiring structure connecting to the contact and active regions of the first gate line and the second gate line, the wiring structure comprising a horizontal contact portion comprising an end of which is connecting to the second gate line and extending over a gate cut in a non-active region and over additional gate structures, and a tab contact portion extending orthogonal to the horizontal contact portion and connecting to an active region of a cross couple circuit comprising the first gate line and the second gate line.

14. The structure to claim 13, wherein the first gate line and the second gate line comprise polysilicon gate structures, and further comprising an insulating liner cap to separate the horizontal contact portion from at least one gate structure.

15. The structure of claim 14, wherein the contact comprises a diagonal contact with ends that extend over the polysilicon gate structures, and further comprising a nitride liner cap to separate the horizontal contact portion from at least one gate structure.

16. The structure of claim 15, wherein the polysilicon gate structures are diagonally spaced apart from one another in a cross couple circuit configuration.

17. The structure of claim 13, wherein the additional gate lines are parallel to the first gate line and the second gate line and which are separated from one another by gate cuts.

18. The structure of claim 17, further comprising gate contacts on a same metal layer as the contact and connecting to the additional gate lines.

19. The structure of claim 17, further comprising a second contact on the first wiring layer, which connects to the contact in a location that is devoid of via connections, and wherein the gate cut is within a shallow trench isolation structure (STI) region.

20. A method comprising:

forming a first contact connected in a cross couple circuit to at least two gate structures; and forming a second contact connected to the first contact at a location which is devoid of any via connections, the second contact comprising a horizontal contact portion comprising an end of which is connecting to the first contact and extending over a gate cut in a non-active region of a first of the at least two gate structures and over additional gate structures, and a tab contact portion extending orthogonal to the horizontal contact portion and connecting to an active region of the cross couple circuit and isolated from the at least two gate structures.

* * * * *